(12) United States Patent
Kiyomizu

(10) Patent No.: US 12,119,816 B2
(45) Date of Patent: Oct. 15, 2024

(54) SEMICONDUCTOR DEVICE AND SEMICONDUCTOR DEVICE CONTROL METHOD

(71) Applicant: LAPIS Technology Co., Ltd., Yokohama (JP)

(72) Inventor: Keisuke Kiyomizu, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 17/953,023

(22) Filed: Sep. 26, 2022

(65) Prior Publication Data

US 2023/0109445 A1    Apr. 6, 2023

(30) Foreign Application Priority Data

Sep. 30, 2021   (JP) .................. 2021-160661

(51) Int. Cl.
*H03K 17/687*   (2006.01)
*H03K 3/037*    (2006.01)

(52) U.S. Cl.
CPC ......... *H03K 17/6872* (2013.01); *H03K 3/037* (2013.01)

(58) Field of Classification Search
CPC .............. H03K 17/6872; H03K 3/037; H03K 3/356017; H03K 17/6871; H03K 17/6874; H03K 3/356; H03K 3/356034; H03K 3/356043; H03K 3/356052; H03K 3/35606; H03K 19/0175; H03K 3/12; Y02D 10/00
See application file for complete search history.

(56) References Cited

U.S. PATENT DOCUMENTS

| | | | |
|---|---|---|---|
| 6,316,956 B1 * | 11/2001 | Oglesbee | H03K 19/00392 326/82 |
| 2005/0007176 A1 | 1/2005 | Seki | |
| 2007/0229139 A1 * | 10/2007 | Lin | H03K 3/356104 327/333 |

FOREIGN PATENT DOCUMENTS

| | | |
|---|---|---|
| JP | H08-147976 A | 6/1996 |
| JP | 2004-363843 A | 12/2004 |

* cited by examiner

*Primary Examiner* — Jung Kim
(74) *Attorney, Agent, or Firm* — RABIN & BERDO, P.C.

(57) ABSTRACT

A semiconductor device, includes: a first first-conductivity-type transistor supplied with a first power source voltage and controlled by an output signal of a first input inverter; a second first-conductivity-type transistor supplied with the first power source voltage and controlled by an output signal of a second input inverter that inverts an output signal of the first input inverter; a first and a second second-conductivity-type transistor supplied with a second power source voltage; and a third and a fourth first-conductivity-type transistor that are connected in parallel either between the first first-conductivity-type transistor and the first second-conductivity-type transistor or between the second first-conductivity-type transistor and the second second-conductivity-type transistor, and that are configured to isolate either a first node connected to the first first-conductivity-type transistor or a second node connected to the second first-conductivity-type transistor from the second power source voltage in accordance with the first power source voltage.

6 Claims, 11 Drawing Sheets

FIG.1
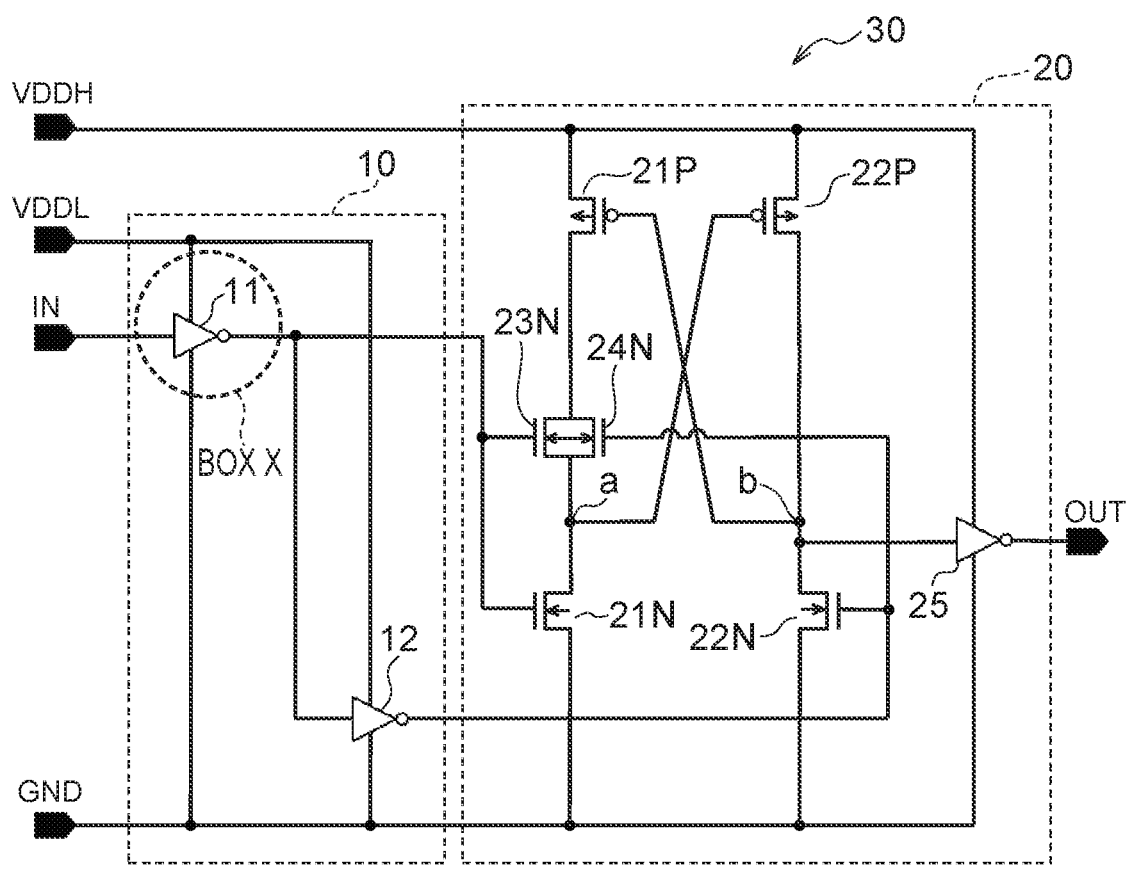
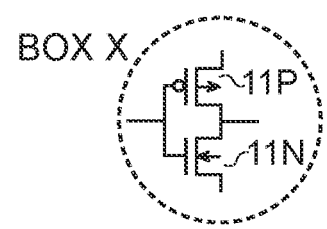

FIG.4
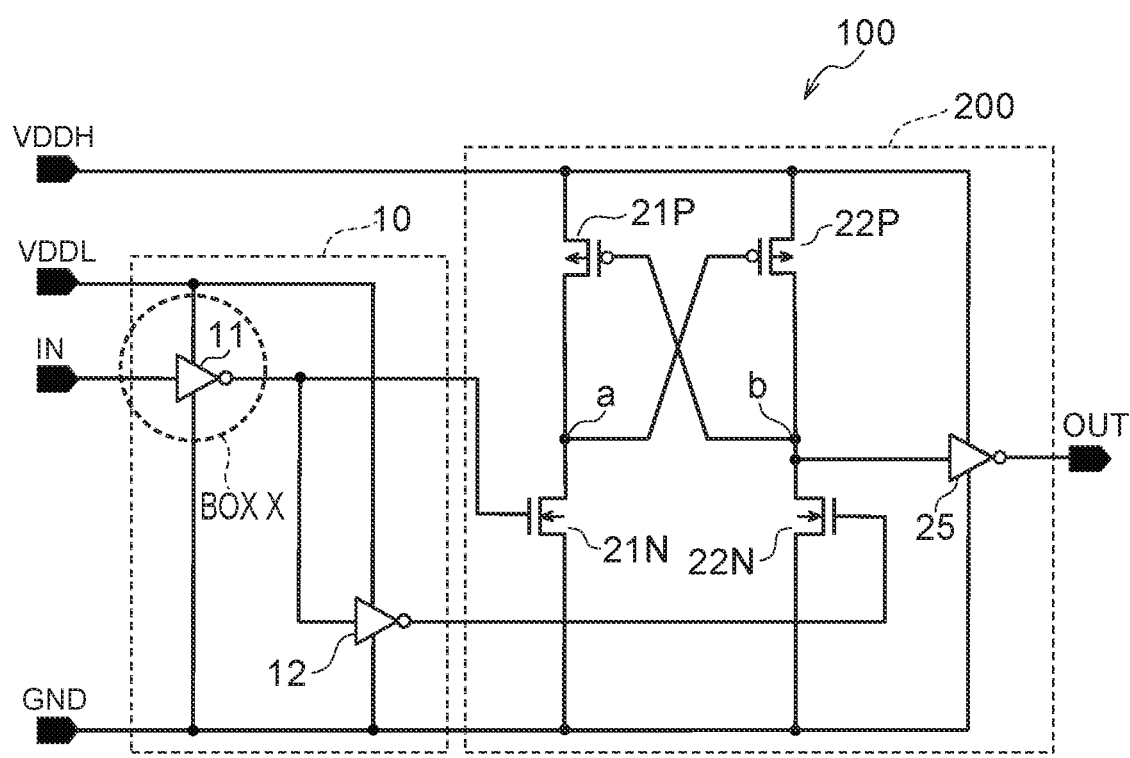
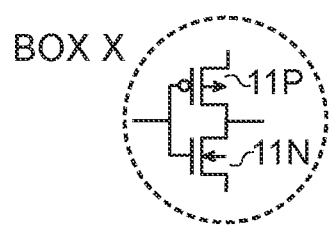

FIG.5
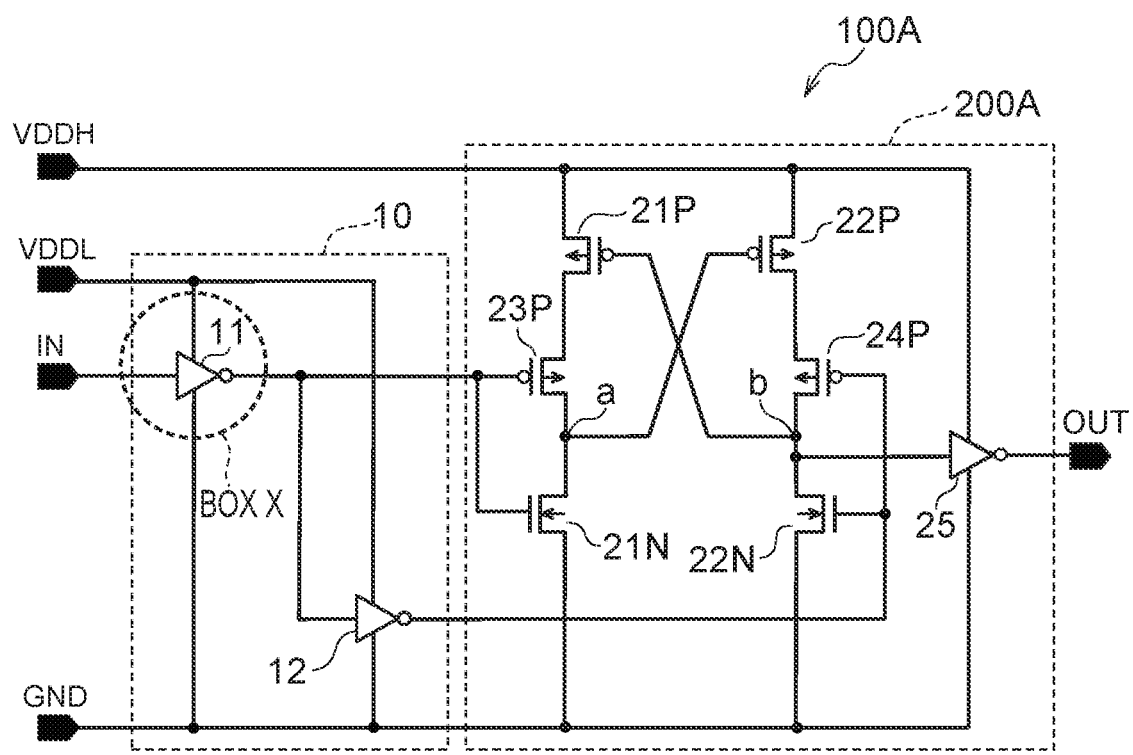
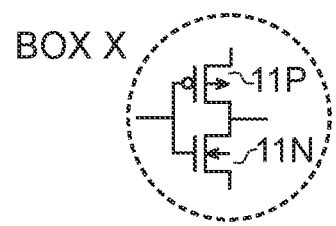

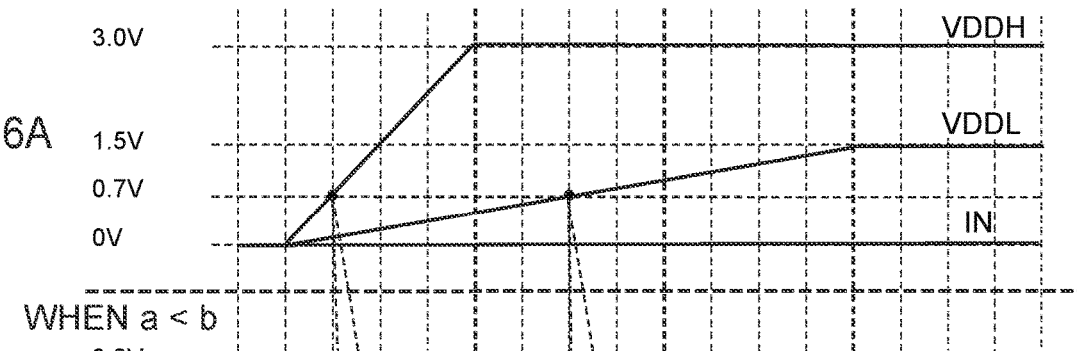
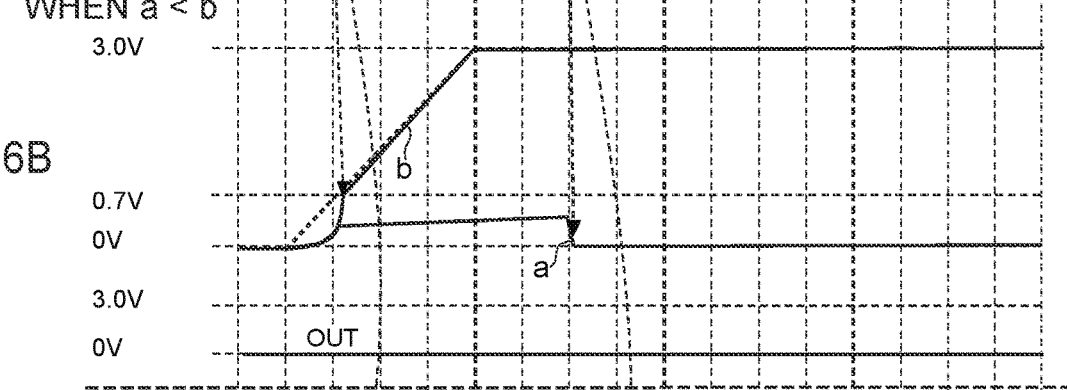
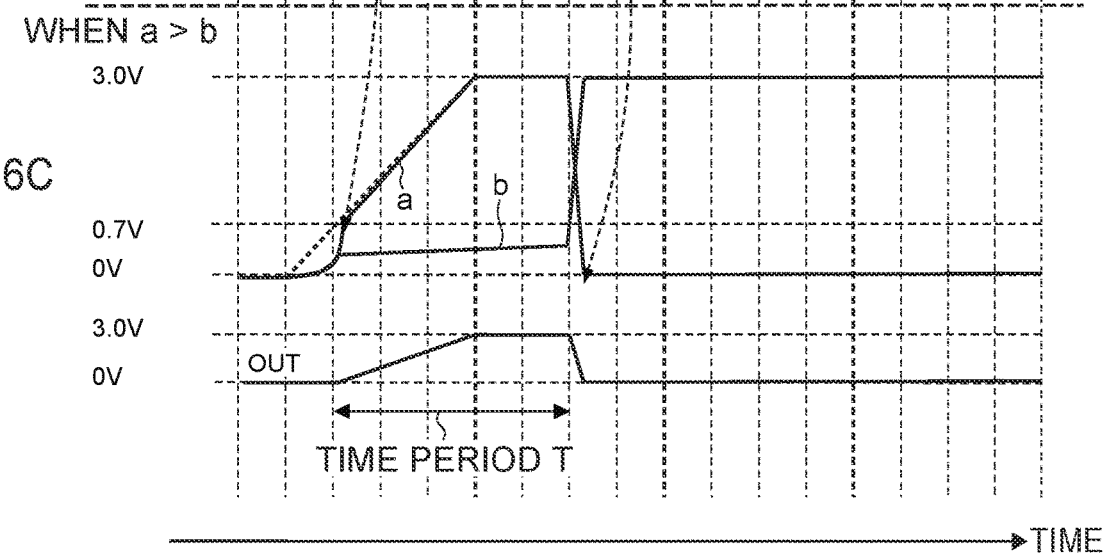

SEMICONDUCTOR DEVICE AND SEMICONDUCTOR DEVICE CONTROL METHOD

CROSS-REFERENCE TO RELATED APPLICATION

This application is based on and claims priority under 35 USC 119 from Japanese Patent Application No. 2021-160661 filed on Sep. 30, 2021, the disclosure of which is incorporated by reference herein.

BACKGROUND

Technical Field

The present disclosure relates to a semiconductor device and a control method for a semiconductor device.

Related Art

In a microcomputer and a large scale integration (LSI) system, generally a high voltage side I/O power source and a low voltage side core power source are separated from each other, and sometimes the core power source is stepped down by a regulator or the like to achieve a lower power consumption.

For example, a semiconductor integrated circuit described in Japanese Patent Application Laid-Open (JP-A) No. 2004-363843 is supplied and operates with a first power source voltage and a second power source voltage higher than the first power source voltage. This semiconductor integrated circuit includes at least one transistor to step down the second power source voltage, at least one first stage level shifter that is operated at a voltage supplied from the second power source voltage through the at least one transistor and that shifts a level of a signal input from a circuit operated at the first power source voltage, and a final stage level shifter that is operated at the second power source voltage and that shifts a level of a signal input from the at least one first stage level shift.

In power source configurations such as this, a level shift circuit is employed for signal handover from the low voltage side core power source to the high voltage side I/O power source. However, when the I/O power source switch is thrown on, the output signal of the level shift circuit is unstable until the core power source reaches the target voltage, leading to an issue of malfunction of a later stage circuit operated by an output signal of the level shift circuit.

SUMMARY

The present disclosure provides a semiconductor device and a semiconductor device control method capable of preventing malfunction of a later stage circuit operated by an output signal of a level shift circuit when a low power source voltage is not being sufficiently supplied.

A semiconductor device according to the present disclosure is a semiconductor device that operates at a first power source voltage and at a second power source voltage higher than the first power source voltage. The semiconductor device includes: a first first-conductivity-type transistor supplied with the first power source voltage and controlled by an output signal of a first input inverter that inverts an input signal; a second first-conductivity-type transistor supplied with the first power source voltage and controlled by an output signal of a second input inverter that inverts an output signal of the first input inverter; a first second-conductivity-type transistor supplied with the second power source voltage; a second second-conductivity-type transistor supplied with the second power source voltage; and a third first-conductivity-type transistor and a fourth first-conductivity-type transistor that are connected in parallel either between the first first-conductivity-type transistor and the first second-conductivity-type transistor or between the second first-conductivity-type transistor and the second second-conductivity-type transistor, and that are configured to isolate either a first node connected to the first first-conductivity-type transistor or a second node connected to the second first-conductivity-type transistor from the second power source voltage in accordance with the first power source voltage.

Moreover, a semiconductor device control method according to the present disclosure is a control method for a semiconductor device including: a first first-conductivity-type transistor supplied with the first power source voltage and controlled by an output signal of a first input inverter that inverts an input signal; a second first-conductivity-type transistor supplied with the first power source voltage and controlled by an output signal of a second input inverter that inverts an output signal of the first input inverter; a first second-conductivity-type transistor supplied with the second power source voltage higher than the first power source voltage; a second second-conductivity-type transistor supplied with the second power source voltage; and a third first-conductivity-type transistor and a fourth first-conductivity-type transistor that are connected in parallel either between the first first-conductivity-type transistor and the first second-conductivity-type transistor or between the second first-conductivity-type transistor and the second second-conductivity-type transistor, and that are configured to isolate either a first node connected to the first first-conductivity-type transistor or a second node connected to the second first-conductivity-type transistor from the second power source voltage. The semiconductor device control method includes: when the first power source voltage is a specific voltage or greater, configuring different voltage levels for an output signal of the first input inverter and an output signal of the second input inverter, and effecting control so as to place one or other of the third first-conductivity-type transistor or the fourth first-conductivity-type transistor in an ON state; and when the first power source voltage is lower than the specific voltage, configuring both the output signal of the first input inverter and the output signal of the second input inverter at the same voltage level, and effecting control so as to place both the third first-conductivity-type transistor and the fourth first-conductivity-type transistor in an OFF state.

The present disclosure enables a later stage circuit operated by an output signal of a level shift circuit to be prevented from malfunctioning when a low power source voltage is not being sufficiently supplied.

BRIEF DESCRIPTION OF THE DRAWINGS

Exemplary embodiments of the present disclosure will be described in detail based on the following figures, wherein:

FIG. 1 is a circuit diagram illustrating an example of a configuration of a semiconductor device according to a first exemplary embodiment;

FIG. 4 is a circuit diagram illustrating a configuration of a semiconductor device according to a comparative example;

FIG. 5 is a circuit diagram illustrating a configuration of an alternative semiconductor device according to a comparative example;

FIG. 6A to FIG. 6C are diagrams illustrating operation waveforms of an alternative semiconductor device according to a comparative example;

DETAILED DESCRIPTION

Figure 2:
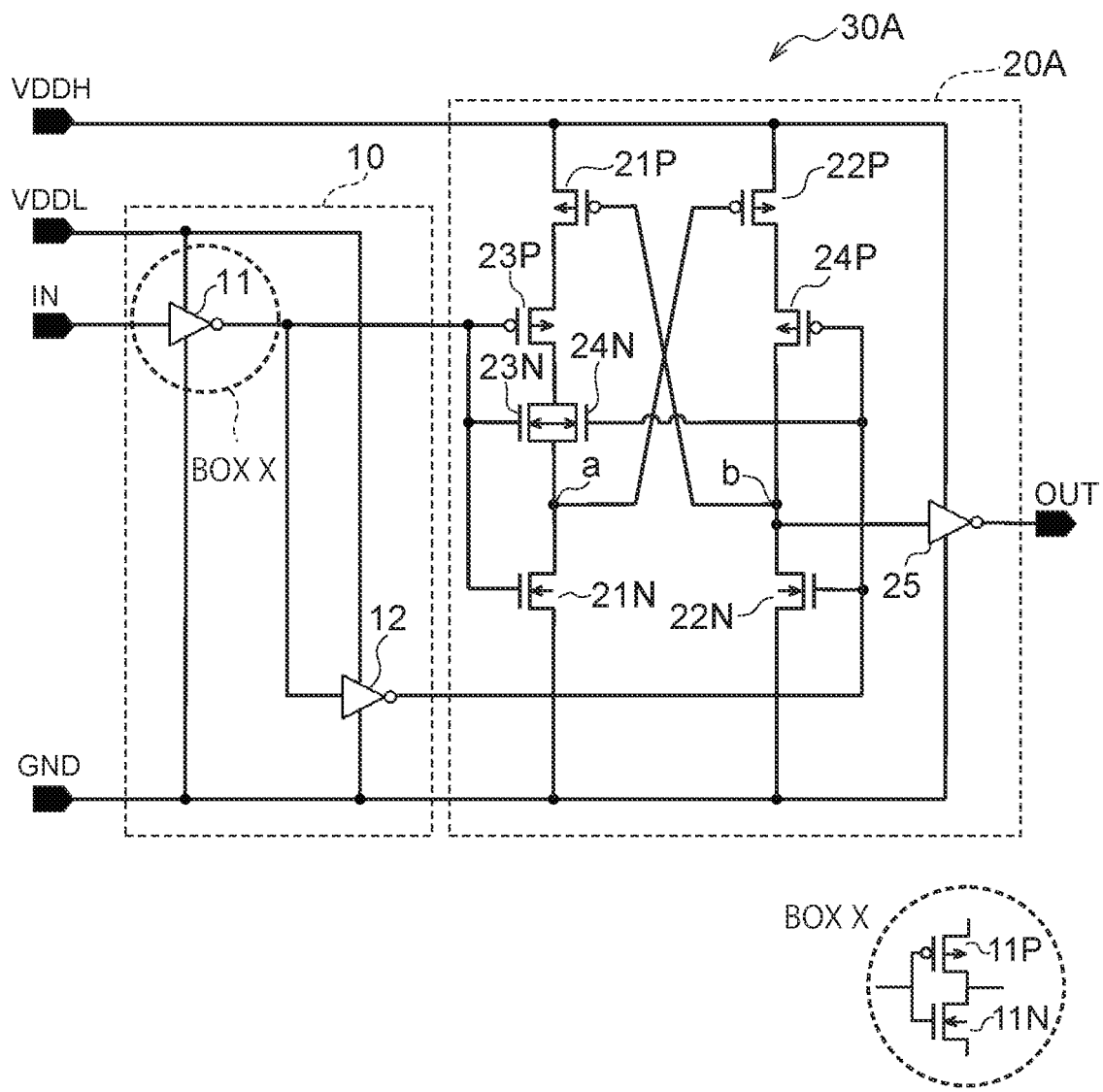
FIG. 2 is a circuit diagram illustrating an example of a configuration of an alternative semiconductor device according to the first exemplary embodiment.

Detailed description follows regarding an example of an embodiment to implement the technology disclosed herein, with reference to the drawings. Note that configuration elements and processing performing the same action, operation, or function are appended with the same reference numerals throughout the drawings, and sometimes duplicate explanation thereof is omitted where appropriate. The drawings are each merely no more than outline drawings to enable a sufficient understanding of the technology disclosed herein. The technology disclosed herein is accordingly not limited by the examples illustrated in the drawings. In the present exemplary embodiment, explanation of configuration not directly related to the present disclosure and explanation of known configuration is sometimes omitted.

First Exemplary Embodiment

FIG. 1 is a circuit diagram illustrating an example of a configuration of a semiconductor device 30 according to a first exemplary embodiment.

Note that in the semiconductor device 30 according to the present exemplary embodiment, in cases in which a first conductivity-type is P-type conductivity then a second conductivity-type is N-type conductivity, and in cases in which the first conductivity-type is N-type conductivity then the second conductivity-type is P-type conductivity.

As illustrated in FIG. 1, the semiconductor device 30 according to the present exemplary embodiment includes a function as a level shift circuit. The semiconductor device 30 is broadly divided into a first circuit 10 operated at a low power source voltage VDDL, and a second circuit 20 operated at a high power source voltage VDDH. Note that the low power source voltage VDDL is an example of a low voltage side first power source voltage, and the high power source voltage VDDH is an example of a high voltage side second power source voltage higher than the low power source voltage VDDL. IN represents an input signal, OUT represents an output signal, and GND represents ground.

The first circuit 10 includes a first input inverter 11 and a second input inverter 12. The first input inverter 11 operates at the low power source voltage VDDL, is input with the input signal IN, inverts the input signal IN and outputs an output signal. The second input inverter 12 operates at the low power source voltage VDDL, is input with the output signal of the first input inverter 11, inverts the output signal of the first input inverter 11 and outputs an output signal. A specific example of a configuration of the first input inverter 11 is illustrated in box X. The first input inverter 11 is configured from a NMOS (metal oxide semiconductor) transistor 11N and a PMOS transistor 11P. A specific example of a configuration of the second input inverter 12 and of a later-described output inverter 25 is similar to that of the first input inverter 11.

A second circuit 20 is configured including a first NMOS transistor 21N, a second NMOS transistor 22N, a third NMOS transistor 23N, a fourth NMOS transistor 24N, a first PMOS transistor 21P, a second PMOS transistor 22P, and an output inverter 25. An output signal of the first input inverter 11 is supplied to a gate of the first NMOS transistor 21N, and the source thereof is connected to GND. An output signal of the second input inverter 12 is supplied to a gate of the second NMOS transistor 22N, and the source thereof is connected to GND. The high power source voltage VDDH is supplied to the source of the first PMOS transistor 21P. The high power source voltage VDDH is supplied to the source of the second PMOS transistor 22P, and the drain thereof is connected to the drain of the second NMOS transistor 22N. A gate of the second PMOS transistor 22P is connected to a first node a that is connected to the drain of the first NMOS transistor 21N (hereinafter also referred to as first NMOS transistor 21N-side first node a), and a gate of the first PMOS transistor 21P is connected to a second node b that is connected to the drain of the second NMOS transistor 22N (hereinafter also referred to as second NMOS transistor 22N-side second node b).

Note that the first NMOS transistor 21N is an example of a first first-conductivity-type transistor, and the second NMOS transistor 22N is an example of a second first-conductivity-type transistor. The third NMOS transistor 23N is an example of a third first-conductivity-type transistor, and the fourth NMOS transistor 24N is an example of a fourth first-conductivity-type transistor. The first PMOS transistor 21P is an example of a first second-conductivity-type transistor, and the second PMOS transistor 22P is an example of a second second-conductivity-type transistor.

The output inverter 25 is an inverter operating at the high power source voltage VDDH, has an input connected to the drain of the second NMOS transistor 22N, and has an output connected to the output signal OUT.

In the present exemplary embodiment the third NMOS transistor 23N and the fourth NMOS transistor 24N are connected in parallel between the drain of the first NMOS transistor 21N and the drain of the first PMOS transistor 21P. Being connected in parallel means that the source of the third NMOS transistor 23N and the source of the fourth NMOS transistor 24N are common, and the drain of the third NMOS transistor 23N and the drain of the fourth NMOS transistor 24N are common. The third NMOS transistor 23N and the fourth NMOS transistor 24N include a function to isolate the first NMOS transistor 21N-side first node a from the high power source voltage VDDH when the low power source voltage VDDL is not being supplied sufficiently.

An output signal of the first input inverter 11 is supplied to a gate of the third NMOS transistor 23N, and an output signal of the second input inverter 12 is supplied to a gate of the fourth NMOS transistor 24N. The first node a is provided between the first NMOS transistor 21N and the third NMOS transistor 23N (and the fourth NMOS transistor 24N). The second node b is provided between the second NMOS transistor 22N and the second PMOS transistor 22P.

Explanation follows regarding a control method for the semiconductor device 30. First, when the low power source voltage VDDL is being supplied sufficiently, the output signal of the first input inverter 11 and the output signal of the second input inverter 12 always have an inverse relationship, namely are different to each other, and so when one of the voltage levels is L level (for example 0V) the other voltage level is H level (for example 1.5V). This means that the third NMOS transistor 23N and the fourth NMOS transistor 24N are controlled such that one thereof is always in an ON state. In cases in which L level (for example 0V) is supplied as the input signal IN, the first NMOS transistor 21N and the third NMOS transistor 23N adopt the ON state and the second NMOS transistor 22N and the fourth NMOS transistor 24N adopt the OFF state. Due to the first NMOS transistor 21N being ON, the first node a is connected to GND and so the second PMOS transistor 22P becomes ON, and the high power source voltage VDDH is supplied to the second node b. Thus due to the high power source voltage VDDH being supplied to the second node b, the output signal OUT inverted by the output inverter 25 becomes L level (for example 0V). In cases in which the H level (for example 1.5V) is supplied as the input signal IN, the first NMOS transistor 21N and the third NMOS transistor 23N adopt the OFF state and the second NMOS transistor 22N and the fourth NMOS transistor 24N adopt the ON state, with the high power source voltage VDDH being supplied to the first node a, and the second node b connected to GND. The output signal OUT accordingly becomes H level (for example 3.0V). Namely, the drain of the first PMOS transistor 21P and the drain of the first NMOS transistor 21N are always in a connected state, to give operation exactly as in the level shift circuit of a later-described comparative example (see FIG. 4).

Next, when the low power source voltage VDDL starts to be supplied (VDDL=0V), the first input inverter 11 and the second input inverter 12 are not able to operate as inverters, and so the output signal of the first input inverter 11 and the output signal of the second input inverter 12 are both the same voltage level (in this case L level). The third NMOS transistor 23N and the fourth NMOS transistor 24N are thereby both controlled to the OFF state. The first NMOS transistor 21N and the second NMOS transistor 22N are both in the OFF state when this occurs. The first input inverter 11 and the second input inverter 12 are also not able to operate as inverters while supply of the low power source voltage VDDL has started but is not yet being sufficiently supplied (for example, VDDL=0.7V), and so the output signal of the first input inverter 11 and the output signal of the second input inverter 12 both become the same voltage level (in this case L level). Thus the first NMOS transistor 21N, the second NMOS transistor 22N, the third NMOS transistor 23N, and the fourth NMOS transistor 24N are controlled to the OFF state. Namely, the drain of the first PMOS transistor 21P and the drain of the first NMOS transistor 21N are always in a non-connected state from start of the low power source voltage VDDL supply until sufficiently supplied. The first node a is isolated from the high power source voltage VDDH and fixed at L level by both the third NMOS transistor 23N and the fourth NMOS transistor 24N being OFF. However the second node b is able to change to H level together with the high power source voltage VDDH. As a result the output signal OUT of the level shift circuit is fixed at L level, and the output of the level shift circuit is initialized, namely made L level, even in a state in which the low power source voltage VDDL is not being sufficiently supplied, such as when the high power source voltage VDDH switch is thrown.

FIG. 2 is a circuit diagram illustrating an example of a configuration of an alternative semiconductor device 30A according to the first exemplary embodiment.

As illustrated in FIG. 2, the semiconductor device 30A according to the present exemplary embodiment includes a function as a level shift circuit, similarly to the semiconductor device 30 illustrated in FIG. 1. The semiconductor device 30A is broadly divided into the first circuit 10 and a second circuit 20A.

The first circuit 10 includes a first input inverter 11 and a second input inverter 12.

The second circuit 20A includes a first NMOS transistor 21N, a second NMOS transistor 22N, a third NMOS transistor 23N, a fourth NMOS transistor 24N, a first PMOS transistor 21P, a second PMOS transistor 22P, a third PMOS transistor 23P, a fourth PMOS transistor 24P, and an output inverter 25. Note that the third PMOS transistor 23P is an example of a third second-conductivity-type transistor, and the fourth PMOS transistor 24P is an example of a fourth second-conductivity-type transistor.

The third PMOS transistor 23P is connected between the first NMOS transistor 21N and the first PMOS transistor 21P. An output signal of the first input inverter 11 is supplied to a gate of the third PMOS transistor 23P. A first inverter is configured by the third PMOS transistor 23P and the first NMOS transistor 21N. The fourth PMOS transistor 24P is connected between the second NMOS transistor 22N and the second PMOS transistor 22P. An output signal of the second input inverter 12 is supplied to a gate of the fourth PMOS transistor 24P. A second inverter is configured by the fourth PMOS transistor 24P and the second NMOS transistor 22N.

In the present exemplary embodiment, the third NMOS transistor 23N and the fourth NMOS transistor 24N are connected in parallel between the drain of the first NMOS transistor 21N and the drain of the third PMOS transistor 23P. Similarly to in the semiconductor device 30 illustrated in FIG. 1, the third NMOS transistor 23N and the fourth NMOS transistor 24N include a function to isolate the first NMOS transistor 21N-side first node a from the high power source voltage VDDH when the low power source voltage VDDL is not being sufficiently supplied.

The output signal of the first input inverter 11 is supplied to the gate of the third NMOS transistor 23N, and the output signal of the second input inverter 12 is supplied to the gate of the fourth NMOS transistor 24N. The first node a is provided between the first NMOS transistor 21N and the third NMOS transistor 23N (and the fourth NMOS transistor 24N). The second node b is provided between the second NMOS transistor 22N and the fourth PMOS transistor 24P.

Explanation follows regarding a control method for the semiconductor device 30A. First, when the low power source voltage VDDL is being supplied sufficiently, the output signal of the first input inverter 11 and the output signal of the second input inverter 12 always have an inverse relationship, namely are different to each other, and so when one of the voltage levels is L level (for example 0V) the other voltage level is H level (for example 1.5V). This means that the third NMOS transistor 23N and the fourth NMOS transistor 24N are controlled such that one thereof is always in an ON state. The first NMOS transistor 21N and the fourth PMOS transistor 24P are in the ON state and the second NMOS transistor 22N and the third PMOS transistor 23P are in the OFF state in cases in which L level (for example 0V) is supplied as the input signal IN. Due to the first NMOS transistor 21N being ON, the first node a is connected to GND and so the second PMOS transistor 22P becomes ON. Thus due to the fourth PMOS transistor 24P being ON, the second node b is supplied with the high power source voltage VDDH. Due to the high power source voltage VDDH being supplied to the second node b, the output signal OUT inverted by the output inverter 25 is accordingly L level (for example 0V). Moreover, in cases in which the H level (for example 1.5V) is supplied as the input signal IN, the first NMOS transistor 21N and the fourth PMOS transistor 24P are in the OFF state and the second NMOS transistor 22N and the third PMOS transistor 23P are in the ON state, the high power source voltage VDDH is supplied to the first node a, and the second node b connected to GND. The output signal OUT is accordingly at H level (for example 3.0V). Namely, the drain of the third PMOS transistor 23P and the drain of the first NMOS transistor 21N are always in a connected state, to give operation exactly as in the level shift circuit of a later-described comparative example (see FIG. 5).

Next, when the low power source voltage VDDL starts to be supplied (VDDL=0V), the first input inverter 11 and the second input inverter 12 are not able to operate as inverters, and so the output signal of the first input inverter 11 and the output signal of the second input inverter 12 are both the same voltage level (in this case L level). The third NMOS transistor 23N and the fourth NMOS transistor 24N are thereby both controlled to the OFF state. The first NMOS transistor 21N and the second NMOS transistor 22N are in the OFF state when this occurs, and the third PMOS transistor 23P and the fourth PMOS transistor 24P are in the ON state. The first input inverter 11 and the second input inverter 12 are also not able to operate as inverters while supply of the low power source voltage VDDL has started but is not yet being sufficiently supplied (for example, VDDL=0.7V), and so the output signal of the first input inverter 11 and the output signal of the second input inverter 12 both become the same voltage level (in this case L level). Thus the first NMOS transistor 21N, the second NMOS transistor 22N, the third NMOS transistor 23N, and the fourth NMOS transistor 24N are controlled to the OFF state, and the third PMOS transistor 23P and the fourth PMOS transistor 24P are controlled to the ON state. Namely, the drain of the third PMOS transistor 23P and the drain of the first NMOS transistor 21N are always in a non-connected state from when supply of the low power source voltage VDDL has started until sufficiently supplied. The first node a is isolate from the high power source voltage VDDH and fixed at L level by the third NMOS transistor 23N and the fourth NMOS transistor 24N both being OFF. However the second node b is able to change to H level together with the high power source voltage VDDH. As a result the output signal OUT of the level shift circuit is fixed at L level, and the output of the level shift circuit is initialized, namely made L level, even in a state in which the low power source voltage VDDL is not being sufficiently supplied, such as when the high power source voltage VDDH switch is thrown.

Figure 3A:
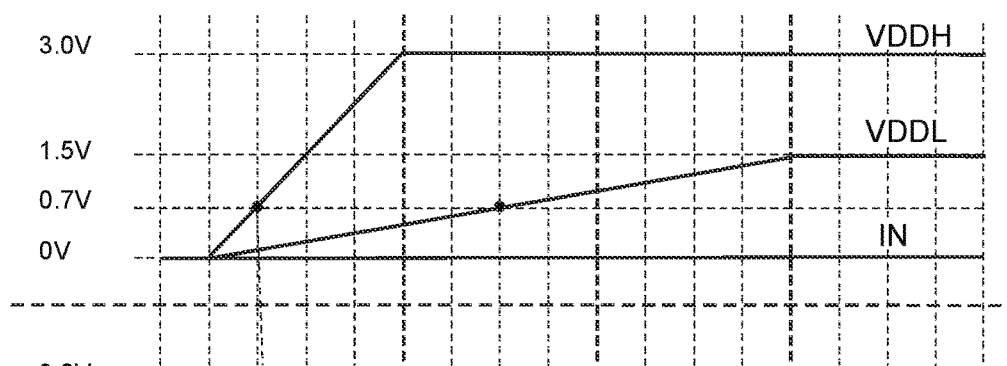
FIG. 3A and FIG. 3B are diagrams illustrating an example of operation waveforms of an alternative semiconductor device according to the first exemplary embodiment.
Figure 3B:
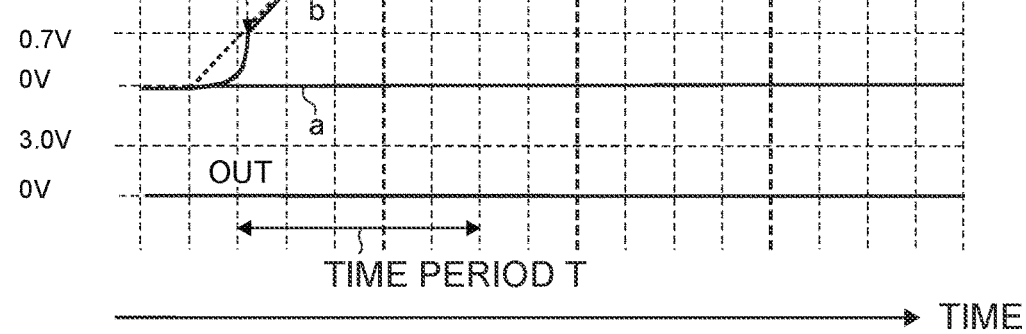

FIG. 3A and FIG. 3B are diagrams illustrating an example of operation waveforms of the alternative semiconductor device 30A according to the first exemplary embodiment. FIG. 3A illustrates operation waveforms of the high power source voltage VDDH, the low power source voltage VDDL, and the input signal IN. FIG. 3B illustrates the operation waveforms of the first node a, the second node b, and the output signal OUT. In the example of FIG. 3A, the low power source voltage VDDL is 1.5V, and a threshold voltage (Vt) of the PMOS/NMOS is 0.7V. The threshold voltage is an example of a specific voltage.

As is apparent from the illustration in FIG. 3A, while the low power source voltage VDDL is not sufficiently supplied (in this case from when low power source voltage VDDL transitions from 0V until reaching 1.5V), the first node a is fixed at L level (in this case 0V) due to the third NMOS transistor 23N and the fourth NMOS transistor 24N both being OFF, however the second node b changes to H level (in this case 3.0V) together with the high power source voltage VDDH. In the example of FIG. 3B, particularly in time period T the L level is initialized with certainty. Namely, the output signal OUT of the level shift circuit is fixed to L level, enabling the output of the level shift circuit to be initialized, namely made L level, even in a state in which the low power source voltage VDDL is not being sufficiently supplied, such as when the high power source voltage VDDH switch is thrown on.

In the present exemplary embodiment as described above, the third NMOS transistor 23N and the fourth NMOS transistor 24N are connected in parallel either between the drain of the first PMOS transistor 21P and the drain of the first NMOS transistor 21N (FIG. 1) or between the drain of the third PMOS transistor 23P and the drain of the first NMOS transistor 21N (FIG. 2), the output of the first input inverter 11 is connected to the gate of the third NMOS transistor 23N, and the output of the second input inverter 12 is connected to the gate of the fourth NMOS transistor 24N. This enables the first node a to be made L level with certainty, and enables the output signal OUT of the level shift circuit to be initialized to L level with certainty, even when the low power source voltage VDDL is not being sufficiently supplied. Moreover, operation when the low power source voltage VDDL is sufficiently supplied is exactly the same as in comparative example level shift circuits (FIG. 4 and FIG. 5), and so the level shift function is maintained without problem.

Next, description follows regarding circuit configurations of semiconductor devices according to comparative examples, with reference to FIG. 4 to FIG. 9.

FIG. 4 is a circuit diagram illustrating a configuration of a semiconductor device 100 according to a comparative example.

The semiconductor device 100 illustrated in FIG. 4 includes a first circuit 10 and a second circuit 200. The second circuit 200 is a circuit configuration not including the third NMOS transistor 23N and the fourth NMOS transistor 24N of the second circuit 20 illustrated in FIG. 1 and described above.

FIG. 5 is a circuit diagram illustrating a configuration of an alternative semiconductor device 100A according to a comparative example.

The semiconductor device 100A illustrated in FIG. 5 includes a first circuit 10 and a second circuit 200A. The second circuit 200A is a circuit configuration not including the third NMOS transistor 23N and the fourth NMOS transistor 24N of the second circuit 20A illustrated in FIG. 2 and described above.

The level shift circuits according to the comparative examples have either the circuit configuration illustrated in FIG. 4 or FIG. 5, and are circuit configurations that assume the low power source voltage VDDL and the high power source voltage VDDH are always supplied at their target voltages.

However, in a power source configuration to generate the low power source voltage VDDL that will be the core power source using a regulator or the like, in the period of time until the low power source voltage VDDL that will be the core power source has reached the target voltage, such as when the high power source voltage VDDH switch is thrown on for the I/O power source, the input signal IN, the output signal of the first input inverter 11, and the output signal of the second input inverter 12 are 0V (L level) as illustrated in both FIG. 4 or FIG. 5, and the first PMOS transistor 21P and the second PMOS transistor 22P (FIG. 4) or the first PMOS transistor 21P to the fourth PMOS transistor 24P (FIG. 5) adopt the ON state, and the first NMOS transistor 21N and the second NMOS transistor 22N each adopt the OFF state.

Due to the first PMOS transistor 21P to the fourth PMOS transistor 24P, the first NMOS transistor 21N, and the second NMOS transistor 22N all being designed to the same dimensions, which node reaches the high power source voltage VDDH first from out of the first node a and the second node b is not known, variations in manufacturing occur, and in some cases the output signal OUT changes (output signal instability occurs) every time the low power source voltage VDDL switch is thrown on. As a result there are sometimes malfunctions in later stage circuits controlled by the output signal of the level shift circuit.

FIG. 6A to FIG. 6C are drawings illustrating operation waveforms of the alternative semiconductor device 100A according to the comparative example. FIG. 6A illustrates the operation waveforms of the high power source voltage VDDH, the low power source voltage VDDL, and the input signal IN, FIG. 6B illustrates operation waveforms of the first node a, the second node b, and the output signal OUT in cases in which the voltage of the first node a is lower than the voltage of the second node b (a<b), and FIG. 6C illustrates operation waveforms of the first node a, the second node b, and the output signal OUT in cases in which the voltage of the first node a is higher than the voltage of the second node b (a>b). In the example of FIG. 6A the low power source voltage VDDL is 1.5V and the threshold voltage (Vt) of the PMOS/NMOS is 0.7V.

Which of the first node a or the second node b will first reach the high power source voltage VDDH is not always known in the time period T illustrated in FIG. 6C, such that magnitude relationships of the voltage of the first node a to the voltage of the second node b differ between when the first node a voltage is lower than the second node b voltage (a<b cases) and the first node a voltage is higher than the second node b voltage (a>b cases). In such cases the output signal OUT is sometimes output at H level unintentionally, as illustrated in FIG. 6C. There are accordingly cases in which output signal instability occurs due to such unintentional output signal OUT, resulting in malfunction of later stage circuits.

Figure 7:
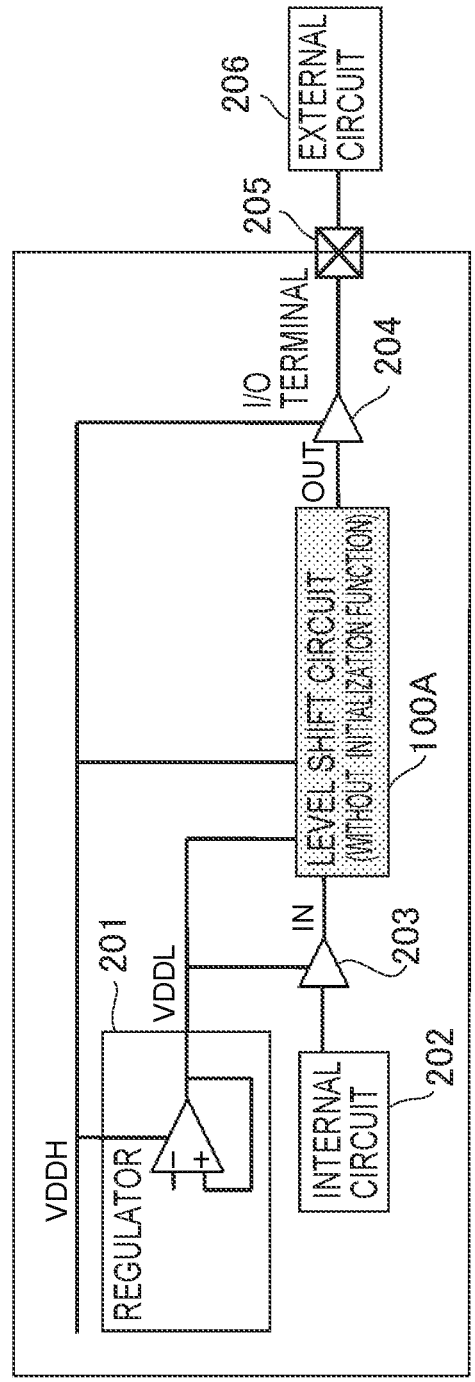
FIG. 7 is a diagram to explain peripheral circuits of an alternative semiconductor device according to a comparative example.

FIG. 7 is a diagram to explain peripheral circuits of an alternative semiconductor device 100A according to the comparative example.

The semiconductor device 100A illustrated in FIG. 7 functions as a level shift circuit without an initialization function, such as illustrated in FIG. 6C. Peripheral circuits including the semiconductor device 100A include a regulator 201, an internal circuit 202, a buffer 203, an I/O buffer 204, and an I/O terminal 205. The regulator 201 transforms the high power source voltage VDDH and outputs the low power source voltage VDDL. The buffer 203 operates at low power source voltage VDDL, and outputs a signal from the internal circuit 202 as the input signal IN. The high power source voltage VDDH and the low power source voltage VDDL are supplied to the semiconductor device 100A, and the input signal IN is input thereto. The output signal OUT output from the semiconductor device 100A is adjusted in drive strength through the I/O buffer 204 and then input to the I/O terminal 205. An external circuit 206 is connected to the I/O terminal 205, and the signal output from the I/O buffer 204 is input to the external circuit 206 through the I/O terminal 205. The comparative example of FIG. 7 results in output signal instability, such as illustrated in FIG. 6C, occurring in the output signal of the semiconductor device 100A (level shift circuit) when the low power source voltage VDDL is not being sufficiently supplied, and also results in output signal instability at the I/O terminal 205 that is the output destination of the semiconductor device 100A when the low power source voltage VDDL is not being sufficiently supplied. Thus, depending on the state of the I/O terminal 205, the external circuit 206 that is a later stage circuit to the semiconductor device 100A (level shift circuit) sometimes malfunctions.

Note that in order to avoid such output signal instability, a conceivable initializable level shift circuit is one in which an input signal RESET operated at the high power source voltage VDDH is added to the circuit configuration illustrated in FIG. 5 to enable the output signal to be decided even when the low power source voltage VDDL is not being sufficiently supplied.

Figure 8:
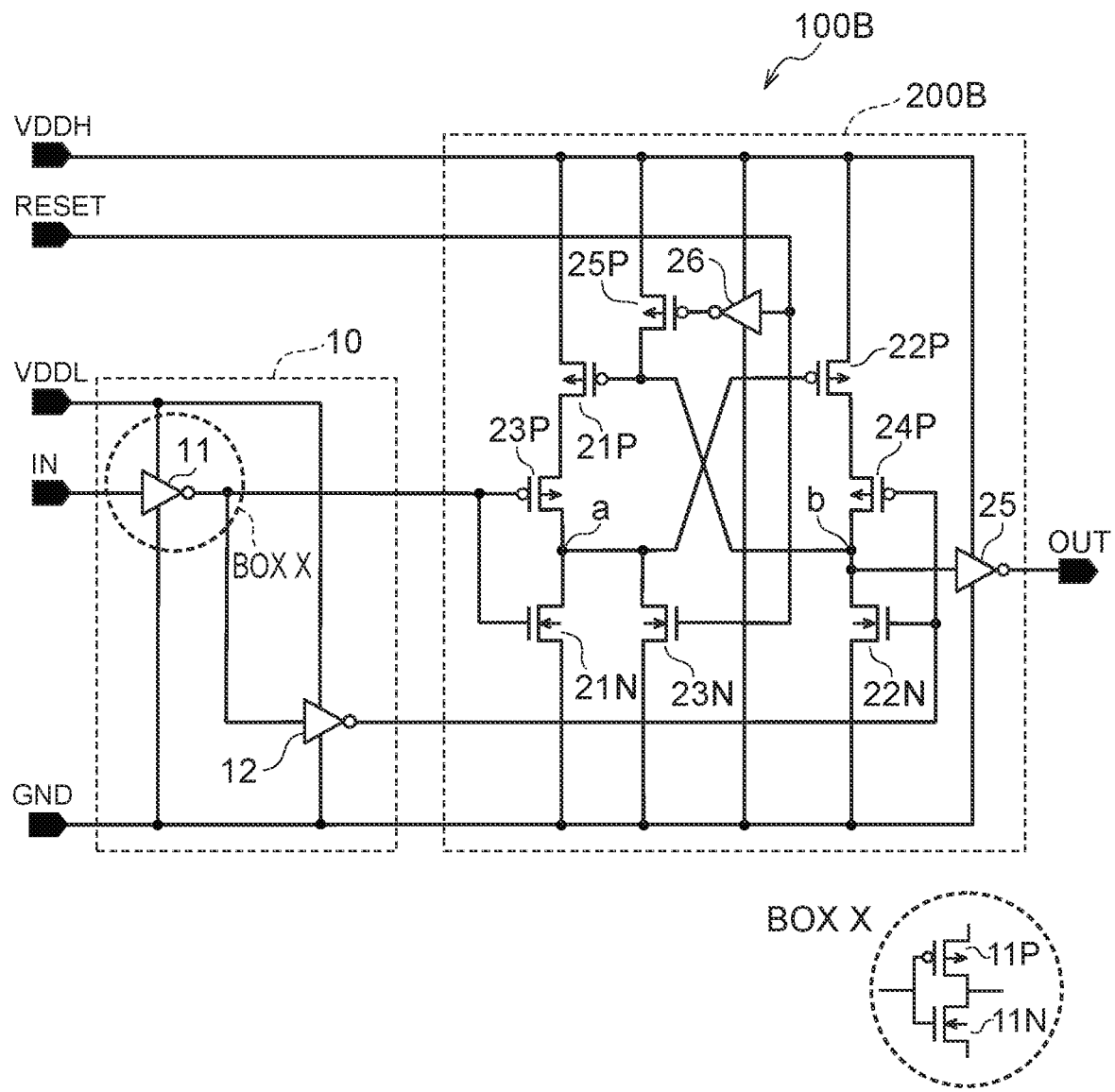
FIG. 8 is a circuit diagram illustrating a configuration of an initializable semiconductor device according to a comparative example.

FIG. 8 is a circuit diagram illustrating as configuration of an initializable semiconductor device 100B according to a comparative example.

The semiconductor device 100B illustrated in FIG. 8 includes a first circuit 10 and a second circuit 200B. The second circuit 200B has, in addition to the input signal RESET, a third NMOS transistor 23N, a fifth PMOS transistor 25P, and an inverter 26 also added to the circuit configuration illustrated in FIG. 5. The inverter 26 operates at the high power source voltage VDDH, and inverts the input signal RESET before outputting as the output signal. The output signal from the inverter 26 is input to a gate of the fifth PMOS transistor 25P, the high power source voltage VDDH is supplied to the source thereof, and the drain is connected to a second node b. The input signal RESET is input to the gate of the third NMOS transistor 23N, the drain thereof is connected to the first node a, and the source is connected to GND. In cases in which H level (for example, 3.0V) is supplied as the input signal RESET, the third NMOS transistor 23N and the fifth PMOS transistor 25P adopt the ON state, the first node a is connected to GND, and the high power source voltage VDDH is supplied to the second node b. The output signal OUT is accordingly L level (for example 0V). The comparative example of FIG. 8 accordingly uses the input signal RESET to fix the output signal OUT even when the low power source voltage VDDL is not being sufficiently supplied.

Figure 9:
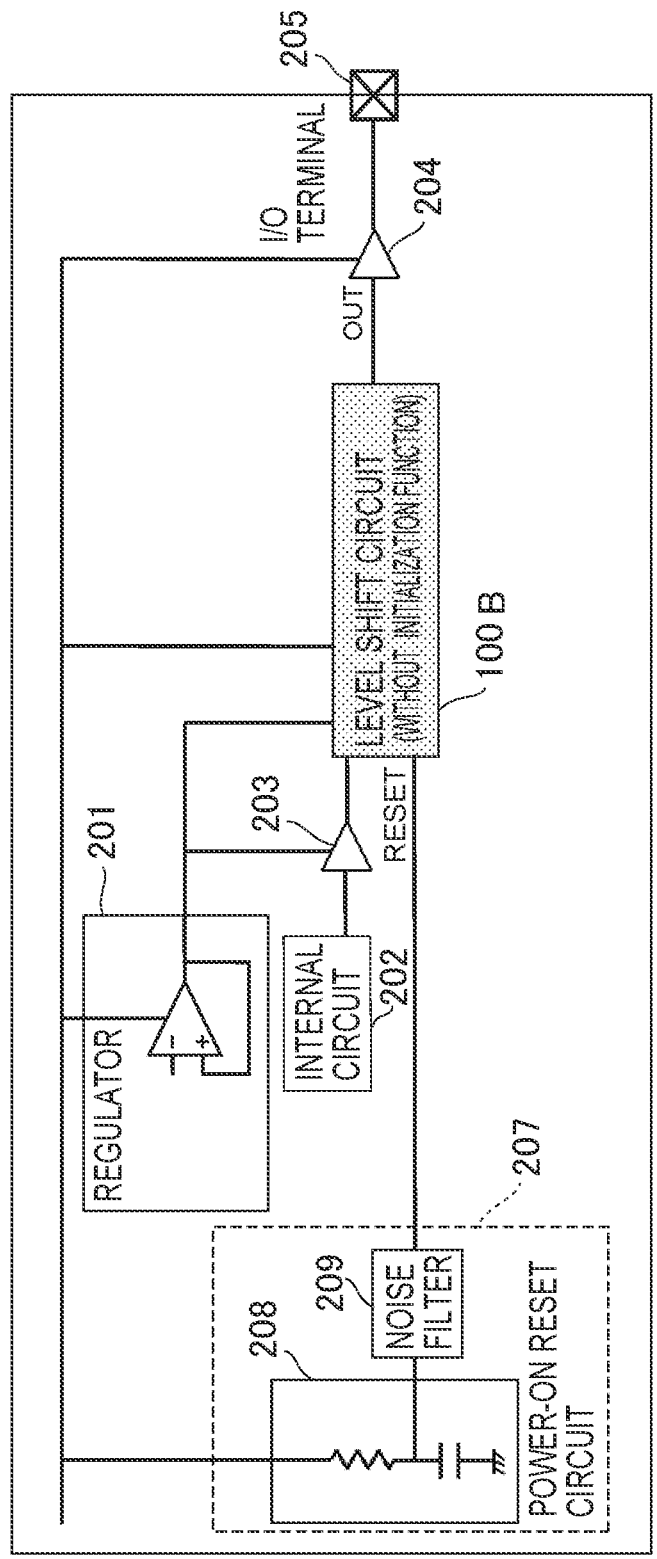
FIG. 9 is a diagram to explain peripheral circuits of an initializable semiconductor device according to a comparative example.

FIG. 9 is a diagram to explain peripheral circuits of the initializable semiconductor device 100B according to the comparative example.

The semiconductor device 100B of FIG. 9 functions as a level shift circuit including an initialization function such as illustrated in FIG. 8. The peripheral circuits including the semiconductor device 100B include a regulator 201, an internal circuit 202, a buffer 203, an I/O buffer 204, an I/O terminal 205, and a power-on reset circuit 207. The peripheral circuits illustrated in FIG. 9 are the peripheral circuits illustrated in FIG. 7 to which the power-on reset circuit 207 has been added. The power-on reset circuit 207 includes a power-on reset (POR) 208 and a noise filter 209. The power-on reset circuit 207 operates at the high power source voltage VDDH, generates the input signal RESET, and outputs to the semiconductor device 100B (level shift circuit). Namely, in the comparative examples of FIG. 8 and FIG. 9, the power-on reset circuit 207 operating at the high power source voltage VDDH is needed to generate the input signal RESET, increasing the circuit surface area and requiring the noise filter 209 and the like to counter noise of the power-on reset circuit 207. The final result thereof is an increase in the cost and sometimes an increase in the difficulty of design.

In contrast to the above comparative examples, adopting the circuit configuration according to the present exemplary embodiment (FIG. 1 or FIG. 2) enables the output signal of the level shift circuit to be fixed even in cases in which the low power source voltage VDDL is not being sufficiently supplied. This enables malfunctions of later stage circuits operated by the output signal of the level shift circuit to be prevented. There is also no need for circuit configuration such as a power-on reset circuit, suppressing cost from rising and enabling a reduction in the difficulty of design.

Second Exemplary Embodiment

An embodiment has been described for the first exemplary embodiment in which the third NMOS transistor and the fourth NMOS transistor are connected in parallel at the first node a side. An embodiment will be described for the second exemplary embodiment in which the third NMOS transistor and the fourth NMOS transistor are connected in parallel at the second node b side.

Figure 10:
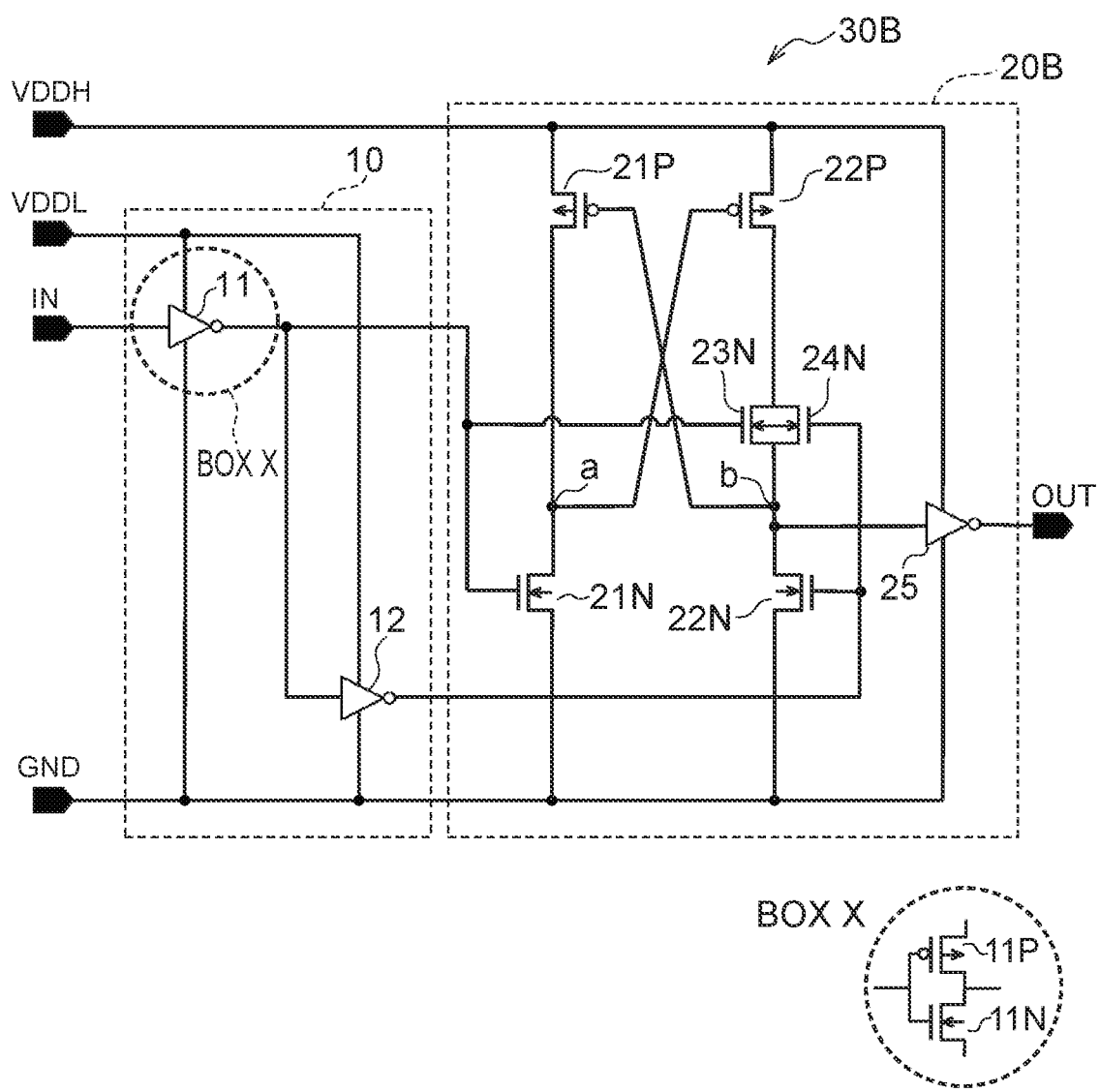
FIG. 10 is a circuit diagram illustrating an example of a configuration of a semiconductor device according to a second exemplary embodiment.

FIG. 10 is a circuit diagram illustrating an example of a configuration of a semiconductor device 30B according to the second exemplary embodiment. Configuration elements the same as configuration elements in the semiconductor device 30 described in the first exemplary embodiment are appended with the same reference numerals and repetitive explanation thereof is omitted.

As illustrated in FIG. 10, the semiconductor device 30B according to the present exemplary embodiment includes the function of a level shift circuit similarly to in the semiconductor device 30 illustrated in FIG. 1. The semiconductor device 30B is broadly divided into a first circuit 10 and a second circuit 20B.

The second circuit 20B includes a first NMOS transistor 21N, a second NMOS transistor 22N, a third NMOS transistor 23N, a fourth NMOS transistor 24N, a first PMOS transistor 21P, a second PMOS transistor 22P, and an output inverter 25.

In the present exemplary embodiment the third NMOS transistor 23N and the fourth NMOS transistor 24N are connected in parallel between the drain of the second NMOS transistor 22N and the drain of the second PMOS transistor 22P. The third NMOS transistor 23N and the fourth NMOS transistor 24N include a function to isolate the second NMOS transistor 22N-side second node b from the high power source voltage VDDH when the low power source voltage VDDL is not being sufficiently supplied.

The circuit configuration illustrated in FIG. 1 and described above has a circuit configuration in which the third NMOS transistor 23N and the fourth NMOS transistor 24N are connected in parallel between the drain of the first PMOS transistor 21P and the drain of the first NMOS transistor 21N. In contrast thereto, the circuit configuration illustrated in FIG. 10 is a circuit configuration in which the third NMOS transistor 23N and the fourth NMOS transistor 24N are connected in parallel between the drain of the second PMOS transistor 22P and the drain of the second NMOS transistor 22N. The output of the level shift circuit is accordingly different, enabling the initial value for supply to the later stage circuits to be changed from L level (FIG. 1) to H level (FIG. 10).

Explanation follows regarding a control method for the semiconductor device 30B. First, when the low power source voltage VDDL is being supplied sufficiently the output signal of the first input inverter 11 and the output signal of the second input inverter 12 always have an inverse relationship, namely are different from each other, such that when one of the voltage levels is L level (for example 0V), the other voltage level is H level (for example 1.5V). This means that the third NMOS transistor 23N and the fourth NMOS transistor 24N are controlled such that one thereof is always in an ON state. The first NMOS transistor 21N and the third NMOS transistor 23N are in the ON state and the second NMOS transistor 22N and the fourth NMOS transistor 24N are in the OFF state in cases in which L level (for example 0V) is supplied as the input signal IN. Due to the first NMOS transistor 21N being ON, the first node a is connected to GND, the second PMOS transistor 22P becomes ON, and the second node b is supplied with the high power source voltage VDDH. Thus due to the high power source voltage VDDH being supplied to the second node b, the output signal inverted by the output inverter 25 becomes L level (for example 0V). In cases in which H level (for example 1.5V) is supplied as the input signal IN, the first NMOS transistor 21N adopts the OFF state, the second NMOS transistor 22N adopts the ON state, the high power source voltage VDDH is supplied to the first node a, and the second node b is connected to GND. The output signal OUT accordingly becomes H level (for example 3.0V). Namely, the drain of the second PMOS transistor 22P and the drain of the second NMOS transistor 22N are always in a connected state.

Next, when the low power source voltage VDDL starts to be supplied (VDDL=0V), the first input inverter 11 and the second input inverter 12 are not able to operate as inverters, and so the output signal of the first input inverter 11 and the output signal of the second input inverter 12 are both the same voltage level (in this case L level). Thus the third NMOS transistor 23N and the fourth NMOS transistor 24N are both controlled to the OFF state. The first NMOS transistor 21N and the second NMOS transistor 22N are both in the OFF state at this time. When the low power source voltage VDDL starts to be supplied but is not yet being sufficiently supplied (for example, VDDL=0.7V), the first input inverter 11 and the second input inverter 12 are not able to operate as inverters, and so the output signal of the first input inverter 11 and the output signal of the second input inverter 12 are both the same voltage level (in this case L level). The first NMOS transistor 21N, the second NMOS transistor 22N, the third NMOS transistor 23N, and the fourth NMOS transistor 24N are thereby controlled to the OFF state. Namely, the drain of the second PMOS transistor 22P and the drain of the second NMOS transistor 22N are always in a non-connected state from when the low power source voltage VDDL starts to be supplied until sufficiently supplied. The second node b is isolate from the high power source voltage VDDH and fixed at L level by the third NMOS transistor 23N and the fourth NMOS transistor 24N both being OFF, however the first node a is able to change to H level together with the high power source voltage VDDH. As a result the output signal OUT of the level shift circuit is fixed at H level, enabling the output of the level shift circuit to be initialized, in this case to H level, even in a state in which the low power source voltage VDDL is not being sufficiently supplied, such as when the high power source voltage VDDH switch is thrown on.

Figure 11:
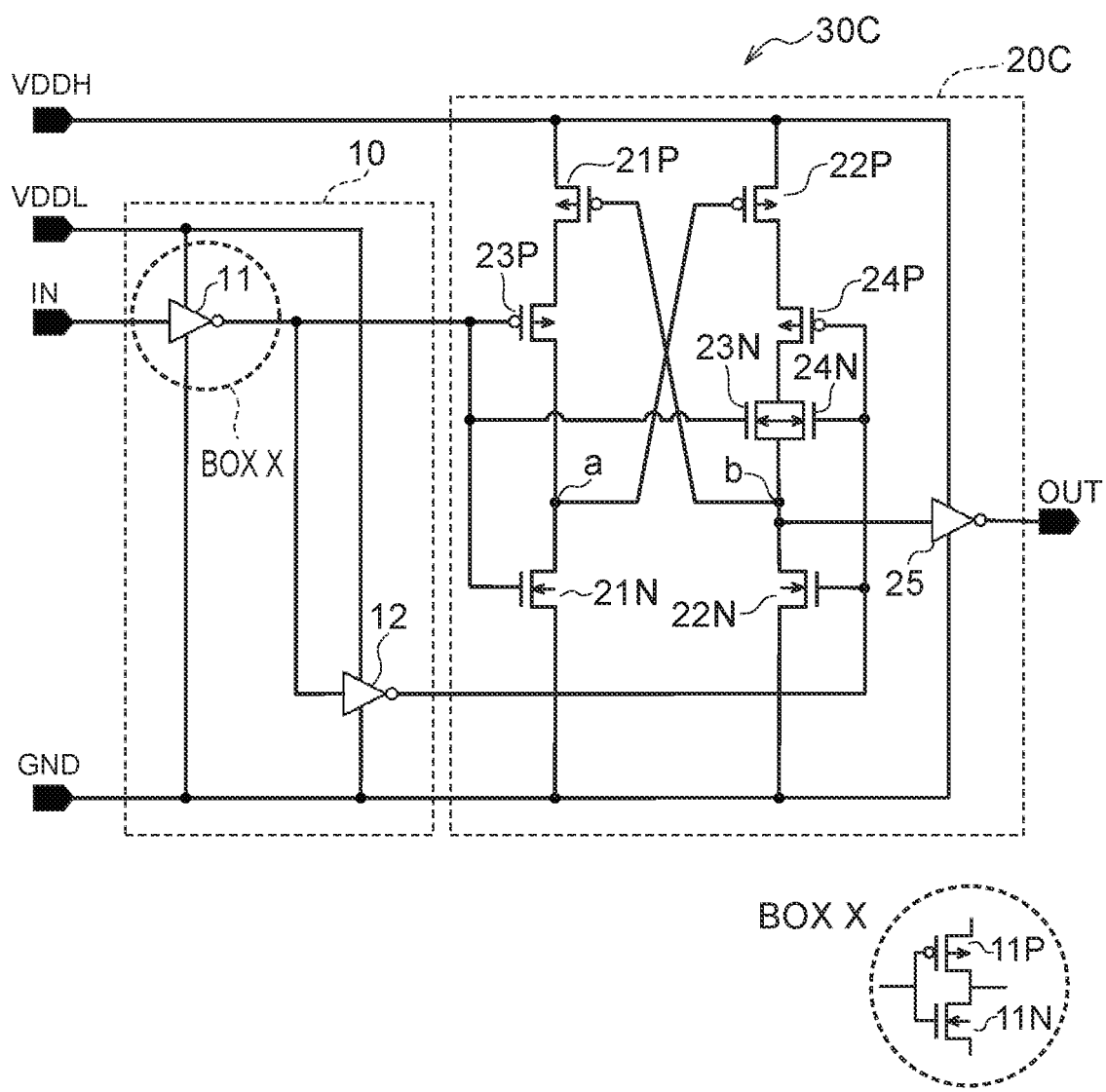
FIG. 11 is a circuit diagram illustrating an example of a configuration of an alternative semiconductor device according to the second exemplary embodiment.

FIG. 11 is a circuit diagram illustrating an example of a configuration of an alternative semiconductor device 30C according to the second exemplary embodiment. Note that configuration elements the same as the configuration elements in the semiconductor device 30A described in the first exemplary embodiment are appended with the same reference numerals and repetitive explanation thereof is omitted.

As illustrated in FIG. 11, the semiconductor device 30C according to the present exemplary embodiment includes a function as a level shift circuit, similarly to the semiconductor device 30A illustrated in FIG. 2. The semiconductor device 30C is broadly divided into a first circuit 10 and a second circuit 20C.

The second circuit 20C includes a first NMOS transistor 21N, a second NMOS transistor 22N, a third NMOS transistor 23N, a fourth NMOS transistor 24N, a first PMOS transistor 21P, a second PMOS transistor 22P, a third PMOS transistor 23P, a fourth PMOS transistor 24P, and an output inverter 25.

In the present exemplary embodiment the third NMOS transistor 23N and the fourth NMOS transistor 24N are connected in parallel between the drain of the second NMOS transistor 22N and the drain of the fourth PMOS transistor 24P. Similarly to in the semiconductor device 30B illustrated in FIG. 10, the third NMOS transistor 23N and the fourth NMOS transistor 24N include a function to isolate the second NMOS transistor 22N-side second node b from the high power source voltage VDDH when the low power source voltage VDDL is not being sufficiently supplied.

The circuit configuration illustrated in FIG. 2 and described above is a circuit configuration in which the third NMOS transistor 23N and the fourth NMOS transistor 24N are connected in parallel between the drain of the third PMOS transistor 23P and the drain of the first NMOS transistor 21N. In contrast thereto, the circuit configuration illustrated in FIG. 11 is a circuit configuration in which the third NMOS transistor 23N and the fourth NMOS transistor 24N are connected in parallel between the drain of the fourth PMOS transistor 24P and the drain of the second NMOS transistor 22N. This enables the output of the level shifter circuit to be different and the initial value for supply to the later stage circuits to be changed from L level (FIG. 2) to H level (FIG. 11).

Explanation follows regarding a control method of the semiconductor device 30C. First, when the low power source voltage VDDL is being supplied sufficiently the output signal of the first input inverter 11 and the output signal of the second input inverter 12 always have an inverse relationship, namely are different to each other, such that when one of the voltage levels is L level (for example 0V), the other voltage level is H level (for example 1.5V). This means that the third NMOS transistor 23N and the fourth NMOS transistor 24N are controlled such that one thereof is always in an ON state. The first NMOS transistor 21N and the fourth PMOS transistor 24P are in the ON state and the second NMOS transistor 22N and the third PMOS transistor 23P are in the OFF state in cases in which L level (for example 0V) is supplied as the input signal IN. Due to the first NMOS transistor 21N being ON, the first node a is connected to GND, and the second PMOS transistor 22P becomes ON. Due to the fourth PMOS transistor 24P being ON, the second node b is supplied with the high power source voltage VDDH. The output signal OUT inverted by the output inverter 25 accordingly becomes L level (for example 0V) due to the high power source voltage VDDH being supplied to the second node b. Moreover, in cases in which H level (for example 1.5V) is supplied as the input signal IN, the first NMOS transistor 21N and the fourth PMOS transistor 24P adopt the OFF state and the second NMOS transistor 22N and the third PMOS transistor 23P adopt the ON state, and the high power source voltage VDDH is supplied to the first node a and the second node b is connected to GND. The output signal OUT is accordingly at H level (for example 3.0V). Namely, the drain of the fourth PMOS transistor 24P and the drain of the second NMOS transistor 22N are always in a connected state.

Next, the first input inverter 11 and the second input inverter 12 are not able to operate as inverters when the low power source voltage VDDL starts to be supplied (VDDL=0V), and so the output signal of the first input inverter 11 and the output signal of the second input inverter 12 are both the same voltage level (in this case L level). Thus the third NMOS transistor 23N and the fourth NMOS transistor 24N are both controlled to the OFF state. The first NMOS transistor 21N and the second NMOS transistor 22N are both in the OFF state and the third PMOS transistor 23P and the fourth PMOS transistor 24P are both in the ON state at this time. When the low power source voltage VDDL starts to be supplied but is not yet being sufficiently supplied (for example, VDDL=0.7V), the first input inverter 11 and the second input inverter 12 are not able to operate as inverters and so the output signal of the first input inverter 11 and the output signal of the second input inverter 12 are both the same voltage level (in this case L level). Thus the first NMOS transistor 21N, the second NMOS transistor 22N, the third NMOS transistor 23N, and the fourth NMOS transistor 24N are controlled to the OFF state, and the third PMOS transistor 23P and the fourth PMOS transistor 24P are controlled to the ON state. Namely, the drain of the fourth PMOS transistor 24P and the drain of the second NMOS transistor 22N are always in a non-connected state from when supply of the low power source voltage VDDL has started until sufficiently supplied. The second node b is isolate from the high power source voltage VDDH and fixed at L level by the third NMOS transistor 23N and the fourth NMOS transistor 24N both being OFF, however the first node a is able to change to H level together with the high power source voltage VDDH. As a result the output signal OUT of the level shift circuit is fixed at H level, enabling the output of the level shift circuit to be initialized, in this case to H level, even in states in which the low power source voltage VDDL is not being sufficiently supplied, such as when the high power source voltage VDDH switch is thrown on.

In the present exemplary embodiment too, similarly to in the first exemplary embodiment described above, malfunctions of later stage circuits operated by the output signal of the level shift circuit can be prevented when the low power source voltage is not being sufficiently supplied.

Note that configurations of the semiconductor devices and control methods thereof as described in the above exemplary embodiments are merely examples thereof, and obviously the configurations may be modified within a range not departing from the spirit of the exemplary embodiments.

What is claimed is:

1. A semiconductor device that operates at a first power source voltage and at a second power source voltage higher than the first power source voltage and that comprises:

a first first-conductivity-type transistor supplied with the first power source voltage and controlled by an output signal of a first input inverter that inverts an input signal;

a second first-conductivity-type transistor supplied with the first power source voltage and controlled by an output signal of a second input inverter that inverts the output signal of the first input inverter;

a first second-conductivity-type transistor supplied with the second power source voltage;

a second second-conductivity-type transistor supplied with the second power source voltage; and a third first-conductivity-type transistor and a fourth first-conductivity-type transistor that are connected in parallel either between the first first-conductivity-type transistor and the first second-conductivity-type transistor or between the second first-conductivity-type transistor and the second second-conductivity-type transistor, and that are configured to isolate either a first node connected to the first first-conductivity-type transistor or a second node connected to the second first-conductivity-type transistor from the second power source voltage in accordance with the first power source voltage;

wherein:

the output signal of the first input inverter is supplied to a gate of the third first-conductivity-type transistor; and the output signal of the second input inverter is supplied to a gate of the fourth first-conductivity-type transistor.

2. The semiconductor device of claim 1, wherein the third first-conductivity-type transistor and the fourth first-conductivity-type transistor isolate the first node or the second node from the second power source voltage, in cases in which the first power source voltage is lower than a specific voltage.

3. The semiconductor device of claim 1, further comprising:

a third second-conductivity-type transistor connected between the first first-conductivity-type transistor and the first second-conductivity-type transistor, with the third second-conductivity-type transistor combining with the first first-conductivity-type transistor to configure a first inverter and being controlled by the output signal of the first input inverter; and a fourth second-conductivity-type transistor connected between the second first-conductivity-type transistor and the second second-conductivity-type transistor, with the fourth second-conductivity-type transistor combining with the second first-conductivity-type transistor to configure a second inverter and being controlled by the output signal of the second input inverter, wherein:

the third first-conductivity-type transistor and the fourth first-conductivity-type transistor are connected in parallel either between the first first-conductivity-type transistor and the third second-conductivity-type transistor or between the second first-conductivity-type transistor and the fourth second-conductivity-type transistor.

4. The semiconductor device of claim 1, wherein:

the second node is connected to a gate of the first second-conductivity-type transistor; and the first node is connected to a gate of the second second-conductivity-type transistor.

5. The semiconductor device of claim 1, wherein:

the first node is connected to a drain of the first first-conductivity-type transistor; and the second node is connected to a drain of the second first-conductivity-type transistor.

6. The semiconductor device of claim 1, wherein:

the first first-conductivity-type transistor, the second first-conductivity-type transistor, the third first-conductivity-type transistor, and the fourth first-conductivity-type transistor each comprise an NMOS transistor; and the first second-conductivity-type transistor and the second second-conductivity-type transistor each comprise a PMOS transistor.

* * * * *